United States Patent
Yu et al.

(10) Patent No.: US 10,056,124 B2
(45) Date of Patent: Aug. 21, 2018

(54) MEMORY CONTROL DEVICE FOR REPEATING DATA DURING A PREAMBLE SIGNAL OR A POSTAMBLE SIGNAL AND MEMORY CONTROL METHOD

(71) Applicant: Realtek Semiconductor Corporation, Hsinchu (TW)

(72) Inventors: Chun-Chi Yu, Zhubei (TW); Chih-Wei Chang, Zhubei (TW); Shen-Kuo Huang, Hsinchu (TW); Gerchih Chou, San Jose, CA (US)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 15/378,199

(22) Filed: Dec. 14, 2016

(65) Prior Publication Data
US 2018/0166109 A1 Jun. 14, 2018

(51) Int. Cl.
*G11C 7/22* (2006.01)
(52) U.S. Cl.
CPC .................................... *G11C 7/22* (2013.01)
(58) Field of Classification Search
CPC ........................................................ G11C 7/22
See application file for complete search history.

(56) References Cited

U.S. PATENT DOCUMENTS

| | | | |
|---|---|---|---|
| 2004/0022088 A1* | 2/2004 | Schaefer | G11C 7/1045 365/189.07 |
| 2010/0220536 A1* | 9/2010 | Coteus | G06F 13/1689 365/193 |
| 2011/0057721 A1* | 3/2011 | Komyo | G11C 7/1006 327/551 |
| 2013/0258777 A1* | 10/2013 | Wang | G11C 7/1066 365/185.11 |

* cited by examiner

*Primary Examiner* — Pho M Luu
*Assistant Examiner* — Jerome Leboeuf
(74) *Attorney, Agent, or Firm* — McClure, Qualey & Rodack, LLP

(57) ABSTRACT

A memory control device, which includes a signal generating circuit, a data writing circuit and a repeating circuit. The repeating circuit is coupled to the data writing circuit. The signal generating circuit is configured to generate a data strobe signal and send the data strobe signal to a memory. The data strobe signal comprises a preamble signal. The data writing circuit is configured to write a series of data to the memory according to the data strobe signal. The repeating circuit is configured to repeat a first data of the series of data in a period of the preamble signal.

19 Claims, 4 Drawing Sheets

MEMORY CONTROL DEVICE FOR REPEATING DATA DURING A PREAMBLE SIGNAL OR A POSTAMBLE SIGNAL AND MEMORY CONTROL METHOD

BACKGROUND

Technical Field

The present invention relates to memory control technology. More particularly, the present invention relates to a memory control device and a memory control method.

Description of Related Art

At the beginning of burst operation of a memory, waveform of the first data is imperfect because an insufficient initial DC results in a poor output slew rate so that speed of the memory is difficult to be raised. Moreover, at the end if the burst operation of the memory, waveform of the last may be affected by signal reflection because an on-die termination (ODT) is turned off so that the speed of the memory is difficult to be raised.

SUMMARY

An aspect of the present disclosure is a memory control device, which includes a signal generating circuit, a data writing circuit and a repeating circuit. The repeating circuit is coupled to the data writing circuit. The signal generating circuit is configured to generate a data strobe signal and send the data strobe signal to a memory. The data strobe signal comprises a preamble signal. The data writing circuit is configured to write a series of data to the memory according to the data strobe signal. The repeating circuit is configured to repeat a first data of the series of data in a period of the preamble signal.

Another aspect of the present disclosure is a memory control device, which includes a signal generating circuit, a data writing circuit and a repeating circuit. The repeating circuit is coupled to the data writing circuit. The signal generating circuit is configured to generate a data strobe signal and send the data strobe signal to a memory. The data strobe signal comprises a postamble signal. The data writing circuit is configured to write a series of data to the memory according to the data strobe signal. The repeating circuit is configured to repeat a last data of the series of data in a period of the postamble signal.

Another aspect of the present disclosure is a memory control method, which includes steps as follows. A data strobe signal is generated and sent a memory. The data strobe signal comprises a preamble signal. A series of data is written to the memory according to the data strobe signal. A first data of the series of data is repeated in a period of the preamble signal.

In conclusion, the present disclosure can improve the poor waveform of the first data and/or the last data of the series of data without affecting operation of the memory.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
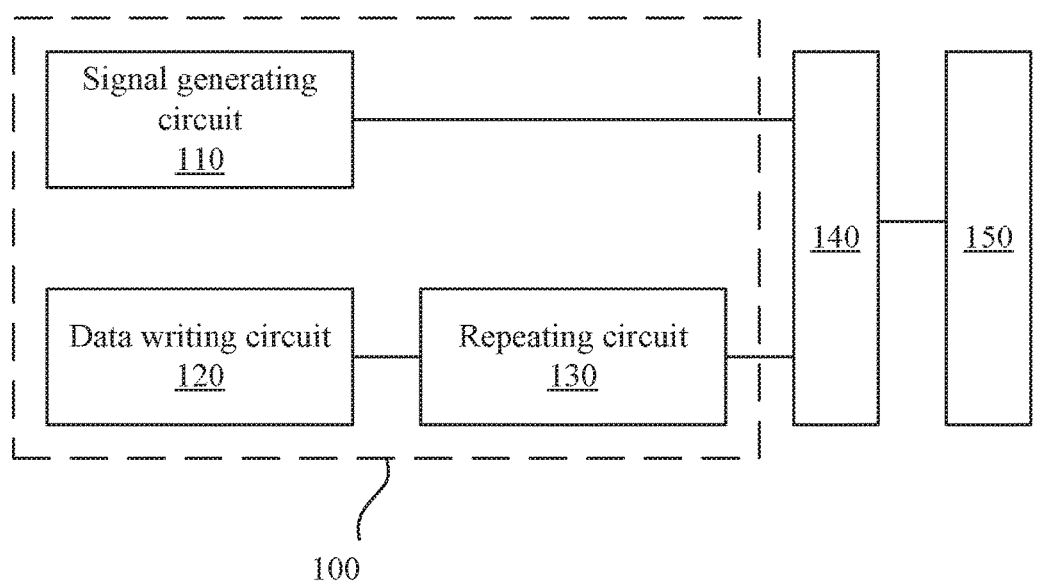
FIG. 1 is a schematic diagram of a memory control device according to an embodiment of the present disclosure.

Reference is made in detail to the present embodiments of the disclosure, examples of which are illustrated in the accompanying drawings. Wherever possible, the same reference numbers are used in the drawings and the description to refer to the same or like parts.

In the following description and claims, the terms "coupled" and "connected," along with their derivatives, may be used. In particular embodiments, "connected" and "coupled" may be used to indicate that two or more elements are in direct physical or electrical contact with each other, or may also mean that two or more elements may be in indirectly electrical contact with each other. The terms "coupled" and "connected" may still be used to indicate that two or more elements cooperate or interact with each other.

Figure 3:
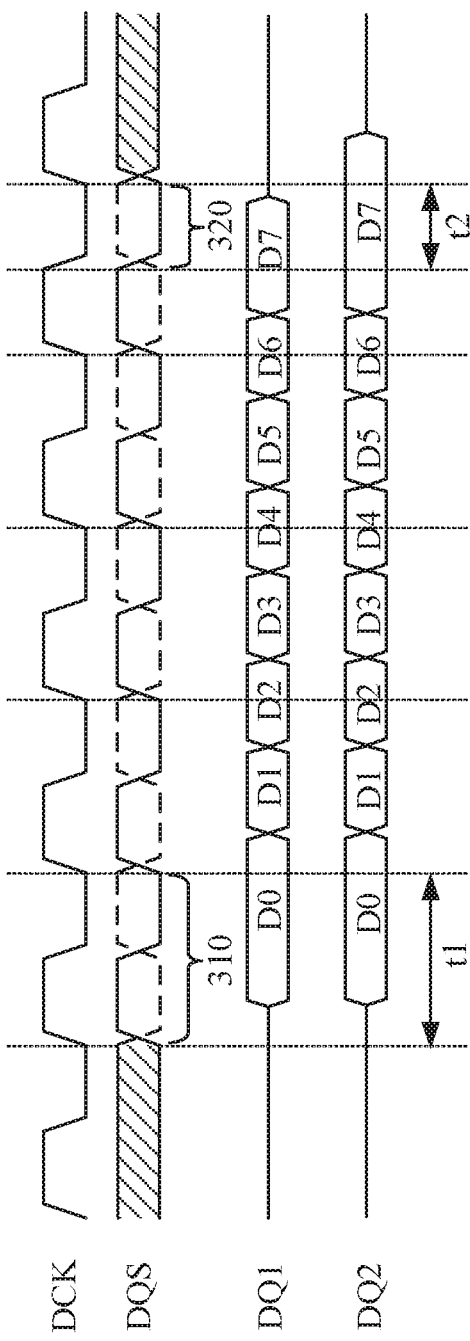
FIG. 3 is a schematic diagram of a data strobe signal and a series of data according to an embodiment of the present disclosure.

Reference is made to FIGS. 1 and 3. FIG. 1 is a schematic diagram of a memory control device 100 according to an embodiment of the present disclosure. The memory control device 100 includes a signal generating circuit 110, a data writing circuit 120 and a repeating circuit 130. The repeating circuit 130 is coupled to the data writing circuit 120. The signal generating circuit is configured to generate a data strobe signal DQS and send the data strobe signal DQS to a memory 150 through input/output pads 140. As shown in FIG. 3, DCK is a clock signal, DQS is the data strobe signal, DQ1 and DQ2 are the series of data D0-D7. It should be noted that the data strobe signal DQS may include a preamble signal 310 and/or a postamble signal 320, and the memory 150 may be in a burst write operation.

The data writing circuit 120 is configured to write a series of data D0-D7 the memory 150 according to the data strobe signal DQS. For example, the data writing circuit 120 may send the series of data D0-D7 to the memory 150 on the rising and falling edges of the data strobe signal DQS, and the memory 150 may be a double data rate synchronous dynamic random access memory (DDR SDRAM), low power DDR SDRAM, pseudo static random access memory (PSDRAM) or a memory that has an open NAND flash interface (ONFI). However, the present disclosure is not limited thereto.

Figure 2A:
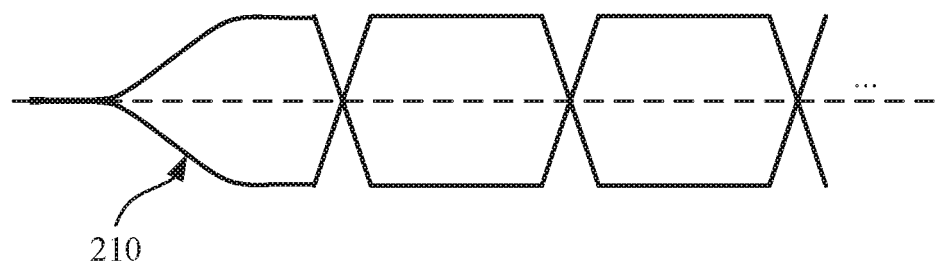
FIG. 2A is a schematic diagram of a series of data.

The repeating circuit 130 is configured to repeat a first data D0 of the series of data D0-D7 in a period t1 of the preamble signal 310. For example, as shown in FIG. 3, the signal generating circuit 110 outputs the data strobe signal DQS with the one cycle preamble signal 310 of and the 0.5 cycle postamble signal 320. In an embodiment, the repeating circuit is configured to repeat the first data D0 of the series of data D0-D7 (i.e., DQ1 or DQ2) in a period t1 of the preamble signal 310. Specifically, because the data strobe signal DQS has the one cycle preamble signal 310, the data writing circuit 120 turns on a pad of the input/output pads 140 and sends the first data D0 earlier than an original first data 210 (as shown in FIG. 2A) by a time that is not more than 1.5 times the cycle time, and the repeating circuit 130 repeats the first data D0 until a start time of the second data Dl. As shown in FIG. 2A, the original first data 210 has a worse waveform than the first data D0.

It should be noted that the time when the data writing circuit 120 sends the first data D0 is adjustable according to different preamble signals. For example, the data writing circuit 120 may send the first data D0 earlier than the original first data 210 (as shown in FIG. 2A) by a time that is not more than 3.5 times the cycle time if the data strobe signal DQS has a two cycle preamble signal.

As a result, the present disclosure can improve the poor waveform of the original first data 210 (as shown in FIG. 2A) of the series of data by turning on the pad of the input/output pads 140 and sending the first data D0 to the memory 150 earlier than the original first data 210. Therefore, the present disclosure solves the insufficient DC problem of the original first data 210. Moreover, the present disclosure repeats the first data D0 in the period t1 of the preamble signal 310 so as to improve the waveform of the first data without affecting operation of the memory 150.

In one embodiment, the repeating circuit is configured to repeat the last data D7 of the series of data D0-D7 (i.e., DQ1) in a period t2 of the postamble signal 320. Specifically, because the data strobe signal DQS has the 0.5 cycle postamble signal 320, the repeating circuit 130 repeats the last data D7 until a time not exceeding the end of the postamble signal 320 so as not to affect operation of the memory 150.

Alternatively, in another embodiment, the repeating circuit 130 is configured to repeat the last data D7 of the series of data D0-D7 (i.e., DQ2) beyond the period t2 of the postamble signal 320. Specifically, the repeating circuit 130 repeats the last data D7 until a time that exceeds the end of the postamble signal 320 and is not overlapped with a period (not shown) of a preamble signal of a next data strobe signal DQS (e.g., a read or write data strobe signal) so as not to affect operation of the memory 150.

It should be noted that if the data writing circuit 120 continuously sends a series of data D0-D15 to the memory 150, then the repeating circuit repeats a last data D15 of the series of data D0-D15 in/beyond a period of a postamble signal (not shown). In other words, the present application repeats the last data of the series of data sent to the memory 150 so as to reduce effect of signal reflection.

Figure 2B:
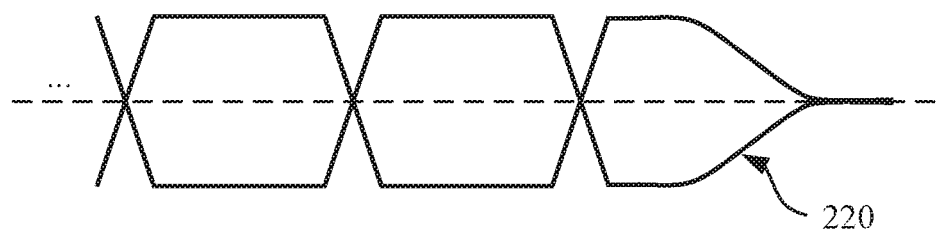
FIG. 2B is a schematic diagram of a series of data.

As a result, the present disclosure can improve the poor waveform of an original last data 220 (as shown in FIG. 2B) of the series of data by reducing effect of signal reflection from an on-die termination (ODT) that is turned off. As shown in FIG. 2B, the original last data 220 has a worse waveform than the last data D7. Moreover, the present disclosure repeats the last data D7 until a time that is not overlapped with the period (not shown) of the preamble signal of the next data strobe signal so as to improve the waveform of the last data without affecting operation of the memory 150.

In one embodiment, the repeating circuit 130 is configured to repeat the first data D0 of the series of data D0-D7 in a period t1 of the preamble signal 310 and the last data D7 of the series of data D0-D7 (i.e., DQ1) in a period t2 of the postamble signal 320. Alternatively, in another embodiment, the repeating circuit 130 is configured to repeat the first data D0 of the series of data D0-D7 in a period t1 of the preamble signal 310 and the last data D7 of the series of data D0-D7 (i.e., DQ2) beyond a period t2 of the postamble signal 320. Specific embodiment is as above described and would not be repeated herein.

As a result, the present disclosure can improve the poor waveform of the original first data 210 (as shown in FIG. 2A) and the original last data 220 (as shown in FIG. 2B) of the series of data without affecting operation of the memory 150.

It should be noted that the number of data in the series of data sent to the memory 150 by the data writing circuit 120 may be another number. Similarly, the repeating circuit 130 is configured to repeat the first data of the series of data in a period t1 of the preamble signal 310 and/or the last data of the series of data in a period t2 of the postamble signal 320.

In practice, the signal generating circuit 110 may be implemented as a data strobe signal DQS generator, and the repeating circuit 130 may be implemented as a repeater.

Figure 4:
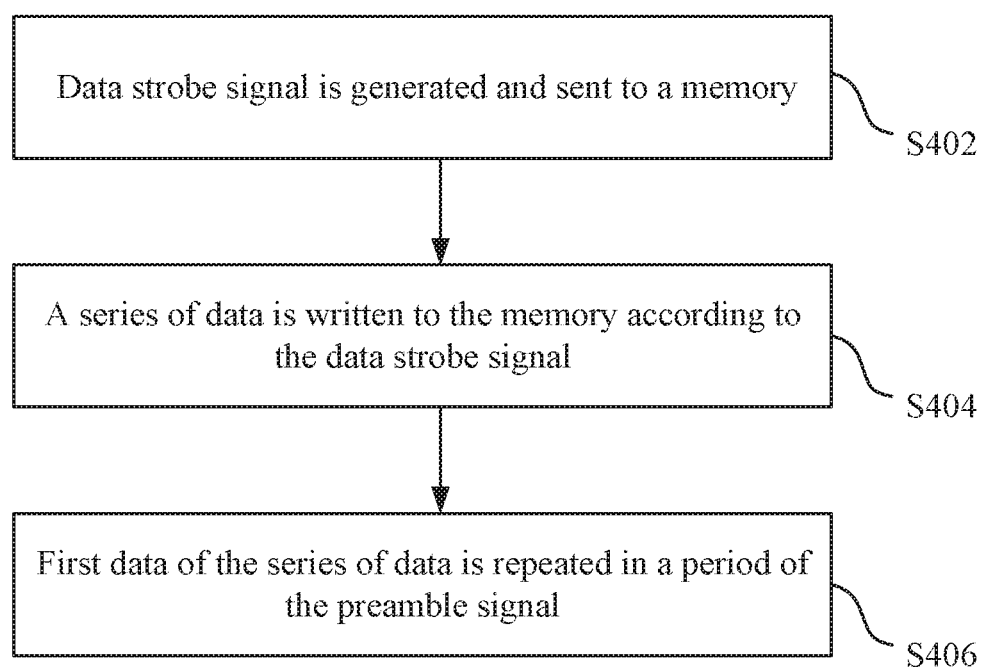
FIG. 4 is a flow chart of a memory control method according to an embodiment of the present disclosure.

Reference is made to FIG. 4. FIG. 4 is a flow chart of a memory control method 400 according to an embodiment of the present disclosure. The memory control method 400 includes steps S402-S406, and the memory control method 400 can be applied to the memory control device 100 as shown in FIG. 1. However, those skilled in the art should understand that the mentioned steps in the present embodiment are in an adjustable execution sequence according to the actual demands except for the steps in a specially described sequence, and even the steps or parts of the steps can be executed simultaneously.

In step S402, a data strobe signal DQS is generated and sent to a memory 150. The data strobe signal DQS comprises a preamble signal 310.

In step S404, a series of data is written to the memory according to the data strobe signal DQS.

In step S406, a first data D0 of the series of data D0-D7 is repeated in a period t1 of the preamble signal 310.

In conclusion, the present disclosure can improve the poor waveform of the first data 210 and/or the last data 220 of the series of data without affecting operation of the memory 150.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory control device, comprising:
    a signal generating circuit, configured to generate a data strobe signal and send the data strobe signal to a memory storage unit, wherein the data strobe signal comprises a postamble signal;
    a data writing circuit, configured to write a series of data to the memory storage unit according to the data strobe signal; and
    a repeating circuit, coupled to the data writing circuit and configured to repeat a last data of the series of data in a period of the postamble signal and to transmit the repeated last data to the memory storage unit, wherein the last data is transmitted at an end of the series of data.

2. The memory control device of claim 1, wherein the data strobe signal further comprises a preamble signal and the repeating circuit is further configured to repeat a first data of the series of data in a period of the preamble signal, wherein the first data is transmitted at a beginning of the series of data.

3. The memory control device of claim 1, wherein the repeating circuit is further configured to repeat the last data of the series of data beyond the period of the postamble signal.

4. The memory control device of claim 1, wherein the memory storage unit is in a burst write operation.

5. The memory control device of claim 1, wherein the memory storage unit is a double data rate synchronous dynamic random access memory (DDR SDRAM).

6. The memory control device of claim 1, wherein the memory storage unit is a low power DDR SDRAM.

7. The memory control device of claim 1, wherein the memory storage unit is a pseudo static random access memory (PSDRAM).

8. The memory control device of claim 1, wherein the memory storage unit has an open NAND flash interface (ONFI).

9. A memory control device, comprising:
a signal generating circuit, configured to generate a data strobe signal and send the data strobe signal to a memory storage unit, wherein the data strobe signal comprises a postamble signal;
a data writing circuit, configured to write a series of data to the memory storage unit according to the data strobe signal; and
a repeating circuit, coupled to the data writing circuit and configured to repeat a last data of the series of data in a period of the postamble signal and to transmit the repeated last data to the memory storage unit, wherein the last data is transmitted at an end of the series of data,
wherein the data strobe signal further comprises a preamble signal, the repeating circuit is further configured to repeat a first data of the series of data in a period of the preamble signal, and the first data is transmitted at a beginning of the series of data.

10. The memory control device of claim 9, wherein the repeating circuit is further configured to repeat the last data of the series of data beyond the period of the postamble signal.

11. The memory control device of claim 9, wherein the memory storage unit is in a burst write operation.

12. The memory control device of claim 9, wherein the memory storage unit is a double data rate synchronous dynamic random access memory (DDR SDRAM).

13. The memory control device of claim 9, wherein the memory storage unit is a low power DDR SDRAM.

14. The memory control device of claim 9, wherein the memory storage unit is a pseudo static random access memory (PSDRAM).

15. The memory control device of claim 9, wherein the memory storage unit has an open NAND flash interface (ONFI).

16. A memory control method, comprising:
generating a data strobe signal and sending the data strobe signal to a memory storage unit, wherein the data strobe signal comprises a postamble signal;
writing a series of data to the memory storage unit according to the data strobe signal; and
repeating a last data of the series of data in a period of the postamble signal and transmitting the repeated last data to the memory storage unit, wherein the last data is transmitted at an end of the series of data.

17. The memory control method of claim 16, further comprising:
repeating a first data of the series of data in a period of a preamble signal, wherein the data strobe signal further comprises the preamble signal, and the first data is transmitted at a beginning of the series of data.

18. The memory control method of claim 16, further comprising:
repeating the last data of the series of data beyond the period of the postamble signal.

19. The memory control method of claim 16, wherein the memory storage unit is in a burst write operation.

\* \* \* \* \*